United States Patent
Saanila et al.

(10) Patent No.: US 6,599,572 B2
(45) Date of Patent: Jul. 29, 2003

(54) PROCESS FOR GROWING METALLOID THIN FILMS UTILIZING BORON-CONTAINING REDUCING AGENTS

(75) Inventors: Ville Antero Saanila, Helsinki (FI); Kai-Erik Elers, Helsinki (FI); Sari Johanna Kaipio, Järvenpää (FI); Pekka Juha Soininen, Espoo (FI)

(73) Assignee: ASM Microchemistry Oy (FI)

( * ) Notice: Subject to any disclaimer, the term of this patent is extended or adjusted under 35 U.S.C. 154(b) by 98 days.

(21) Appl. No.: 09/764,692

(22) Filed: Jan. 18, 2001

(65) Prior Publication Data

US 2001/0009695 A1 Jul. 26, 2001

(30) Foreign Application Priority Data

Jan. 18, 2000 (FI) ................................. 20000099

(51) Int. Cl.$^7$ ..................... C23C 16/06; C23C 16/32
(52) U.S. Cl. ................... 427/249.18; 427/249.17; 427/249.19; 427/250; 427/255.23; 427/255.28; 438/680; 438/681; 438/685; 438/686; 438/687
(58) Field of Search ............. 427/248.1, 249.1, 427/249.5, 249.17, 249.18, 249.19, 250, 253, 255.28, 255.39, 255.23, 255.38, 255.391, 255.392; 117/88, 104; 438/680, 685, 686, 687

(56) References Cited

U.S. PATENT DOCUMENTS

| 3,708,728 A | * | 1/1973 | Sterling et al. ............. 29/25.03 |
| 4,565,747 A | * | 1/1986 | Nakae et al. ............... 428/698 |
| 5,306,666 A | | 4/1994 | Izumi |
| 5,438,028 A | * | 8/1995 | Weissman et al. .......... 502/202 |
| 5,603,771 A | * | 2/1997 | Seiberras et al. .... 118/723 ME |

(List continued on next page.)

FOREIGN PATENT DOCUMENTS

| EP | 0 387 403 A1 | 9/1990 |
| EP | 0 394 054 A1 | 10/1990 |
| EP | 0442 490 | 2/1991 |

(List continued on next page.)

OTHER PUBLICATIONS

Bain et al., "Deposition of tungsten by plasma enhanced chemical vapour deposition," *J. Phys. IV France*, vol. 9, pp. Pr8–827–Pr8–833 (1999).

Ludviksson et al., "Low–Temperature Thermal CVD of Ti–Al Metal Films Using a Strong Reducing Agent," *Chem. Vap. Deposition*, vol. 4, No. 4, pp. 129–132 (1998).

Polyakov et al., "Growth of GaBN Ternary Solutions by Organometallic Vapor Phase Epitaxy," *Journal of Electronic Materials*, vol. 26, No. 3, pp. 237–242 (1997).

Juppo et al., "Deposition of copper films by an alternate supply of CuCl and Zn," *J. Vac. Sci. Technol A*, vol. 15, No. 4, pp. 2330–2333, (Jul./Aug. 1997).

*Primary Examiner*—Shrive P. Beck
*Assistant Examiner*—Wesley Markham
(74) *Attorney, Agent, or Firm*—Knobbe, Martens, Olson & Bear LLP.

(57) ABSTRACT

A process for growing an electrically conductive metalloid thin film on a substrate with a chemical vapor deposition process. A metal source material and a reducing agent capable of reducing the metal source material to a reduced state are vaporized and fed into a reaction space, where the metal source material and the reducing agent are contacted with the substrate. The reducing agent is a boron compound having at least one boron-carbon bond, and the boron compound forms gaseous by-products when reacted with the metal source material. Generally, the boron compound is an alkylboron compound with 0–3 halogen groups attached to the boron. The metal source material and the reducing agent may be fed continuously or in pulses during the deposition process.

10 Claims, 2 Drawing Sheets

U.S. PATENT DOCUMENTS

| | | | |
|---|---|---|---|
| 5,744,254 A | * | 4/1998 | Kampe et al. ............... 428/614 |
| 5,789,024 A | | 8/1998 | Levy et al. ................... 427/244 |
| 5,946,598 A | | 8/1999 | Yeh .............................. 438/683 |
| 5,964,943 A | * | 10/1999 | Stein et al. .................. 117/109 |
| 5,965,004 A | * | 10/1999 | Cowley et al. ............. 205/499 |
| 5,972,430 A | * | 10/1999 | DiMeo, Jr. et al. ..... 427/255.31 |
| 6,006,763 A | | 12/1999 | Mori et al. |
| 6,099,904 A | | 8/2000 | Mak et al. |
| 6,162,501 A | | 12/2000 | Kim |
| 6,380,627 B1 | | 4/2002 | Weihs et al. |

FOREIGN PATENT DOCUMENTS

| | | | |
|---|---|---|---|
| EP | 0 573 033 A1 | 12/1993 | |
| EP | 0 774 533 A1 | 5/1997 | |
| EP | 1 167 567 A1 | 2/2002 | ........... C23C/16/02 |
| JP | 6037041 | 2/1994 | |
| JP | 06-069157 | 3/1994 | |
| JP | 7230957 | 8/1995 | |
| WO | WO 96/18756 | 6/1996 | |
| WO | WO 98/51838 | 11/1998 | |
| WO | WO 99/37655 | 7/1999 | |
| WO | WO 01/29280 A1 | 4/2001 | |
| WO | WO 01/29891 A1 | 4/2001 | |
| WO | WO 01/29893 A1 | 4/2001 | |
| WO | WO 01/66832 A2 | 9/2001 | |

OTHER PUBLICATIONS

Klaus et al., "Atomic Layer Deposition of Tungsten Nitride Films Using Sequential Surface Reactions," *Journal of the Electrochemical Society*, vol. 147, No. 3, pp. 1175–1181, (2000).

Klaus et al., "Atomic layer deposition of tungsten using sequential surface chemistry with a sacrificial stripping reaction," *Thin Solid Films*, vol. 360, pp. 145–153, (2000).

Martensson et al., "Atomic Layer Epitaxy of Copper and Tantalum," *Chemical Vapor Deposition*, vol. 3, No. 1, pp. 45–50, (1997).

Martensson et al., "CU(THD)$_2$ As Copper Source in Atomic Layer Epitaxy," *Electrochemical Society Proceedings*, vol. 97–25, pp. 1529–1536.

Martensson, "Use of atomic layer epitaxy for fabrication of Si/TiN/Cu structures," *J. Vac. Sci. Technol. B*, vol. 17, No. 5, pp. 2122–2128, (Sep./Oct. 1999).

Sherman et al., "Plasma enhanced atomic layer deposition of Ta for diffusion barrier applications," AVS $46^{th}$ International Symposium, Paper TF–TuM5 (abstract), (Oct. 26, 1999), Seattle, WA.

\* cited by examiner

PROCESS FOR GROWING METALLOID THIN FILMS UTILIZING BORON-CONTAINING REDUCING AGENTS

REFERENCE TO RELATED APPLICATION

This application claims priority under 35 U.S.C. §119(a) to Finnish patent application number 20000099, filed Jan. 18, 2000.

BACKGROUND OF THE INVENTION

1. Field of the Invention

The present invention relates to electrically conductive thin films. In particular, the present invention concerns a process for producing transition metal and transition metal carbide thin films by a CVD type using boron compounds as reducing agents.

2. Description of Related Art

In the deposition of metal and metal carbide thin films by CVD, a reducing agent is utilized for lowering the oxidation state, i.e. reducing the metal source compound to a reduced form.

Various reducing agents have been tested, for example cadmium metal vapour or zinc metal, has been proposed previously. The problem of the first reducing process is that cadmium is a rather toxic heavy metal. Zinc, on the other hand, is an efficient reducing element but it may cause troubles in the manufacturing of integrated circuits due to its high diffusivity.

Most efficient reducing elements are found in group 1 of the periodic table of elements. Heavy alkali metals, such as sodium and potassium, can be vaporized easily but they form low-volatility metal halides. Thus, the processing temperature of metal films by the reduction of metal halides with e.g. sodium or potassium must be kept rather high (preferably above 600° C.) to be able to evaporate alkali halides away from the substrate surface.

The reducing agents most typically used at present are hydrogen and silanes ($Si_xH_y$, where x and y are integers).

Typically, the metal source compound used is a halide of the desired metal. When the metal is reduced, the halogen bound to the metal is released and often reacts with the hydrogen or hydrogen-containing reducing agents, provided that hydrogen in the reducing agent is bonded so weakly that it readily reacts with other compounds. Problems may arise, if a hydrogen halide is formed. Hydrogen halides, such as HF and HCl typically deteriorate the surface of the substrate or the thin films layers previously formed.

Silanes that have only silicon and hydrogen in the molecule are extremely reactive compounds and set high requirements for the operation of a process involving the use thereof.

An example of a process in which $H_2$ and $SiH_4$ are used as reducing agents and $WF_6$ is used as the metal source material for depositing elemental metal thin films is disclosed by M. F. Bain. (Deposition of tungsten by plasma enhanced chemical vapour deposition, J. Phys. IV, 9 (1999) pp. 827–833). It is stated in the publication that the deposition of tungsten metal from $WF_6$ on titanium surface caused the formation of titanium fluoride species which incorporated at the titanium-tungsten interface. High fluoride content at the interface may lead to poor adhesion between the layers.

Further, according to literature, hydrogen looses reactivity at low substrate temperatures. Additional energy in the form of e.g. plasma was needed in order to be able to use hydrogen for the reduction of transition metal halides. It is easily understood that the use of extra equipment, such as a plasma generator, adds cost to the process.

The use of other reducing agents, has been disclosed in, for example, JP 6069157, which relates to a CVD process where titanium halide gas is reduced by germane ($Ge_xH_y$) into titanium metal Germanes have also been used for reducing $WF_6$ into W metal. It must be noted that germanes are less stable thermally than silanes so that the reduction process is probably more complicated with germanes. There have been indications of Ge impurities in the film is in the form of a $W_3Ge$ compound.

U.S. Pat. No. 5,946,598 discloses a process in which tungsten fluoride is reduced with silicon on a substrate surface. First, elemental silicon is deposited on substrate. After that tungsten fluoride and silane are introduced into the reaction space. Silicon surface reacts with tungsten fluoride leaving tungsten metal in place of silicon. It must be noted that the applicability of the process can be limited because it is rather difficult to form conformal silicon coating on deep trenches and vias of damascene structures.

A. Ludviksson has disclosed a CVD process where trimethylamine alane reduces titanium halides (Low-temperature thermal CVD of Ti—Al metal film using a strong reducing agent, Chem. Vap. Deposition, 4 (1998) pp. 129–132). There were some troubles with halide contamination of the metal film when aluminum was not codeposited.

WO9851838 discloses a CVD process of growing W metal with $B_2H_6$ as a reducing agent. The claims in the patent cover group IIIA and IVA hydrides. This is a multiple-step process which includes a nucleation step using silane as a reducing agent.

Triethyl boron (shortened as TEB) has been used by A. Y. Polyakov for the deposition of $Ga_{1-x}B_xN$ thin films at the substrate temperature of 450–1000° C. (Growth of GaBN Ternary Solutions by Organometallic Vapor Phase Epitaxy, Journal of Electronic Materials, 26 (1997) pp. 237–242). In this publication boron was incorporated into the growing thin film. The deposition temperature is rather high. Our laboratory experiments show that TEB partially decomposed on the substrate above 400° C. leaving a residue when TEB was carried to the reaction space in flowing nitrogen atmosphere that had an absolute pressure of 5–10 mbar. The residue from TEB possibly consisted of hydrogen-rich boron carbide.

SUMMARY OF THE INVENTION

It is an object of the present invention to eliminate the problems of the prior art and to provide a novel method for growing metal and metal carbide thin films by a Chemical Vapour Deposition (CVD) type process.

In the present context, electrically highly conductive transition metals and transition metal carbides are defined as metalloids.

The invention is based on the surprising finding that a metalloid thin film can be grown on a substrate by a chemical vapour deposition type process by feeding to the reaction space a metal source material and a novel reducing agent in a vaporised state. The reducing agent is capable of reducing said metal source material into reduced state at the conditions in the reaction space. The compound used as the reducing agent is selected from the group of boron compounds, said compounds having at least one boron-carbon bond.

In one aspect, the present invention provides a process for growing a metalloid thin film on a substrate by a chemical vapor deposition type process. In the process, a transition metal source material and a reducing agent capable of reducing the transition metal source material to a reduced state are vaporized and fed into a reaction space, where they are contacted with a substrate. The reducing agent is preferably a boron compound containing at least one boron-carbon bond and that is capable of forming gaseous reaction by-products when reacted with the transition metal source material.

A number of considerable advantages are obtained by means of the present invention. The thin film obtained by the present process has less impurities than those prepared by conventional processes. The use of particular reducing agents enhances the purity of the obtained film, since the compounds used in the present invention form volatile reaction by-products.

With the aid of the present process a metalloid thin film can be grown at temperatures below 400° C. The use of low temperatures is beneficial especially for making metal and metal carbide layers for damascene structures in integrated circuits, and, of course means savings in energy costs and total processing time. Low processing temperature also means that there is less mechanical stress between the tin film and the substrate.

With the aid of the present process, metalloid thin films can be grown very fast and the formation of free hydrogen halides is avoided.

The grown metal thin films can be used as electron conductors or interconnects or seed layers in integrated circuits. The grown metal carbide thin films can be used as diffusion barriers, for example between a dielectric, in particular one having a low k-value, and a copper layer. Diffusion barrier layers preferably comprise carbides of tungsten (W), tantalum (Ta), hafnium (Hf), zirconium (Zr) and/or titanium (Ti), more preferably tungsten carbides. Noble metal thin films, preferably comprising gold (Au), palladium (Pd), platinum (Pt), rhodium (Rh) and/or iridium (Ir), also find use as protective layers on parts which in demanding environments.

Next, the invention will be more closely examined with the aid of the following detailed description and by making reference to the attached drawings.

DETAILED DESCRIPTION OF THE INVENTION

Definitions

For the purposes of the present invention, a "CVD type process" designates a process in which deposition is carried out by bringing vaporised source materials into contact with a substrate, whereby the source materials react with one another. In a CVD process the source materials needed for the thin film growth are present in the reaction space at the same time at least part of the deposition time. Thus, the concentration profiles of the source materials in the reaction space with regard to tine are overlapping.

"Reaction space" is used to designate a reactor or reaction chamber, in which the conditions can be adjusted so as to enable a chemical vapour deposition of thin film from source materials.

"Thin film" is used to designate a film which is grown from elements or chemical compounds that are transported to the reaction space as species consisting of separate ions, atoms or molecules via a medium which enables free movement of said species, the said medium being vacuum, gaseous or liquid phase. The thickness of the film depends on the application and it varies in a wide range, e.g. from three or four molecular layers to 800 nm, even up to 1000 nm.

The Deposition Process

According to the present invention, elemental transition metal and transition metal carbide films are grown by a CVD type process.

According to the present invention, a film is grown on a substrate placed in a heated reaction space. The metal source material and the reducing agent are vaporised and fed to the reaction space. The source materials are present in the reaction space simultaneously at least part of the deposition time. The reagents are brought into contact with the substrate placed in the reaction chamber, whereby the reagents react with each other and a layer of desired species is deposited on the surface of the substrate. It is to be noted that according to the present invention, the reducing agent does not leave harmful levels of impurities to the formed film. Carbon exclusively in the form of carbide is not considered as a harmful impurity. The by-products formed in the reduction reaction are preferably volatile and can be purged away from the reaction space.

The "surface" of the substrate comprises initially the surface of the actual substrate material which optionally has been pretreated in advance, e.g., by contacting it with a chemical for modifying the surface properties thereof. During the growing of the metal or metal carbide thin films, the previous metal or carbide layer forms the surface for the following metal or carbide layer.

In the present process, there are various alternatives for arranging the feeding of the starting materials:

According to a first embodiment of the present invention, the metal source material and the reducing agent are fed to the reaction space simultaneously and continuously, thus, both starting materials are present in the reaction space during the whole deposition process.

Figure 1:
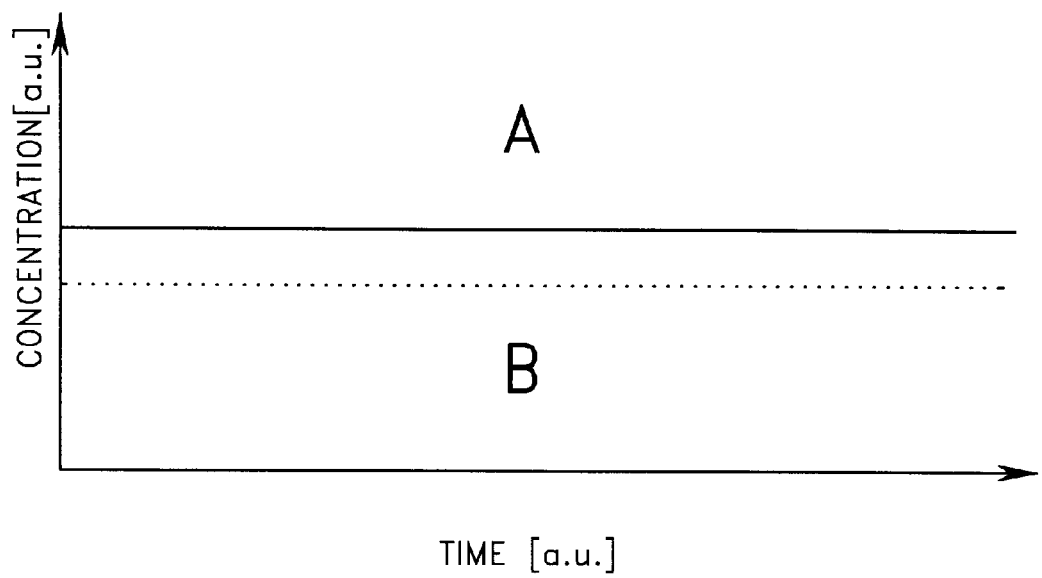
FIG. 1 depicts the concentration of different starting materials in the reaction space in a CVD process wherein a reducing agent and a transition metal compound (source chemicals A and B) are simultaneously and continuously fed to the reaction space during the thin film deposition.

FIG. 1 depicts the concentration of two reagents A and B in a reaction space as a function of time when the feeding of the reagents is arranged according to the first embodiment of the present invention A and B are the metal source material and the reducing agent, although it is equally possible that A represents a reducing agent and B a metal source material. Operation according to this first embodiment is preferably used when the by-products from the thin film deposition do not disturb the film growth and the growth is surface-controlled.

Figure 2:
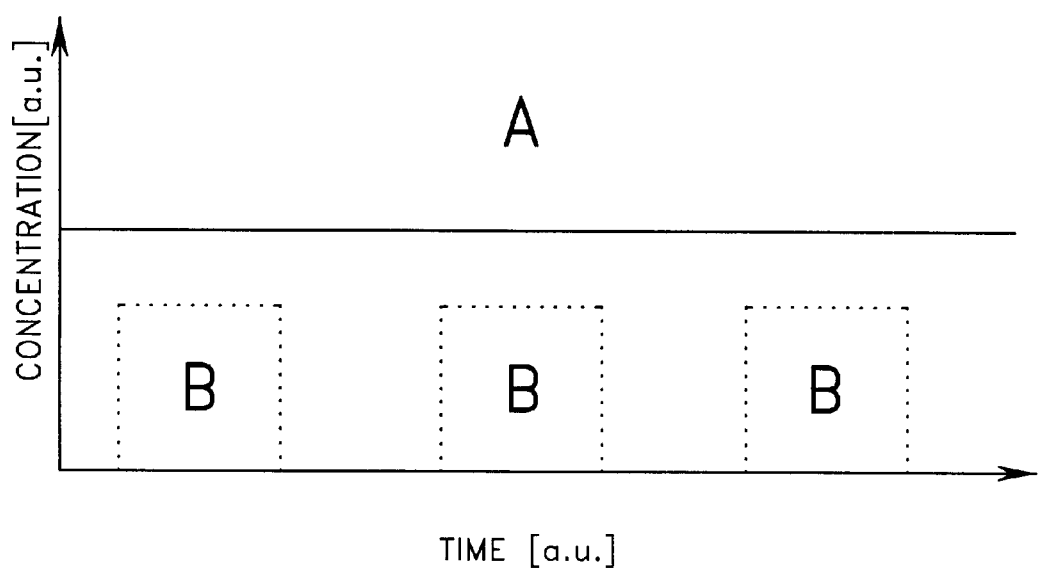
FIG. 2 depicts the concentration of different starting materials in the reaction space in a CVD process wherein one source material is present all the time at the reaction space during the deposition while the other source material is pulsed to the reaction space.

According to a second embodiment of the present invention, a first reagent is present in the reaction space during the whole deposition process, thus, it is fed continuously to the reaction space. A second reagent is fed into the reaction space in pulses. This is illustrated in FIG. 2, where A represents the first reagent and B represents the second reagent. According to one embodiment A is the reducing agent and B the metal source material. According to another embodiment A is the metal source material and B is the reducing agent.

Figure 3:
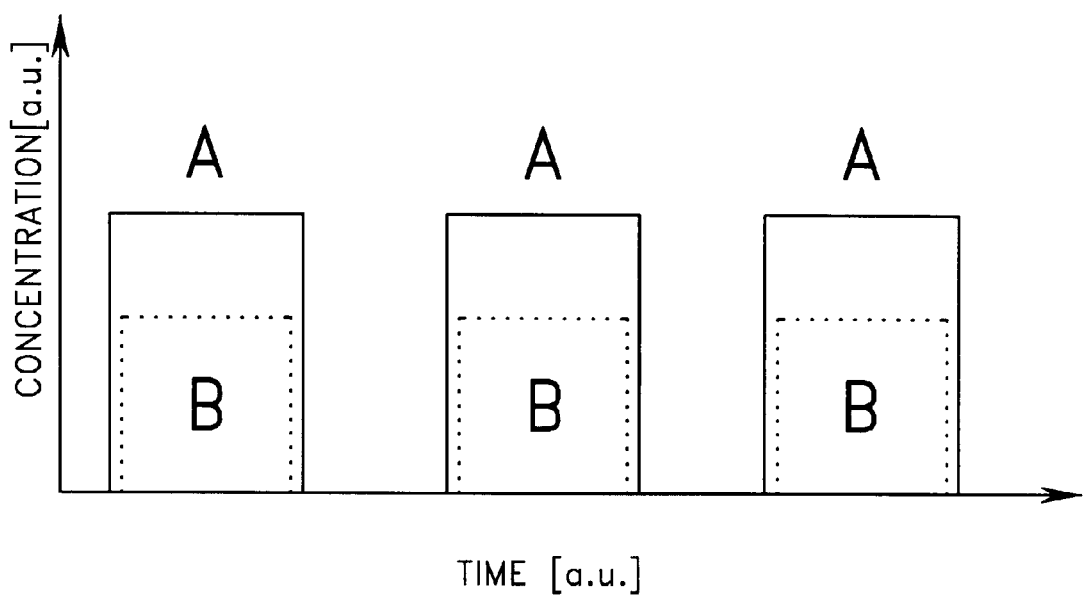
FIG. 3 depicts the concentration of different starting materials in the reaction space in a CVD process wherein a metalloid thin film is grown by feeding essentially simultaneous pulses of a metal source material and a reducing agent into a reaction space.

According to a third embodiment of the present invention the starting materials are fed to the reaction space intermittently (i.e., in pulses) and essentially simultaneously. FIG. 3 illustrates the concentration of reagents A and B in the reaction space as a function of time when the feeding of the reagents is cared out according to the third embodiment. A and B are the metal source material and the reducing agent, although it is equally possible that A represents a reducing agent and B a metal source material.

According to a fourth embodiment of the present invention the starting materials are fed to the reaction space in pulses, which are at least partially overlapping. According to this embodiment, a pulse of a first reagent is fed to the reaction space and, while the first reagent is still present in the reaction space, a pulse of a second reagent is fed into the reaction space. This method of feeding is illustrated in FIG. 4, wherein the concentration of reagent A and reagent B in the reaction space varies as a function of time in pulses, which partially overlap.

Figure 4:
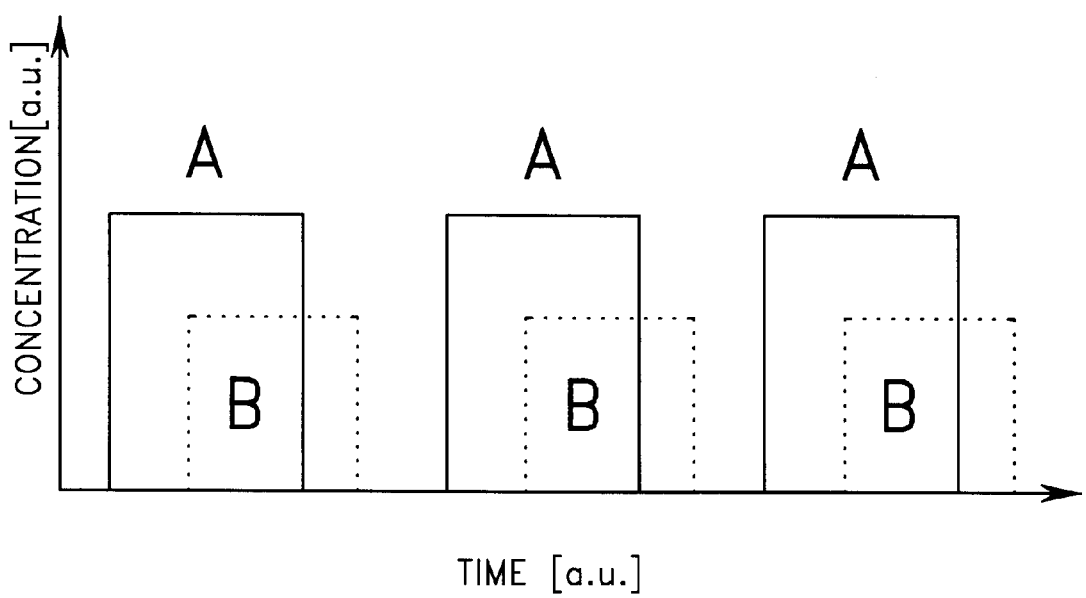
FIG. 4 depicts the concentration of different starting materials in the reaction space in a CVD process wherein two source chemicals (A and B) are pulsed into the reaction space so that the pulses are at least partially overlapping.

It is to be noted that the pulses of source materials in FIGS. 2–4 are drawn with sharp edges to clarify the presentation. In actual operation it takes some time to increase and decrease the concentration of a source chemical at the reaction space.

Source material feeding methods according to second, third and fourth embodiment of the present invention are used especially when the by-products from the thin film deposition disturb the film growth.

The reagents are preferably fed into the reactor with the aid of an inert carrier gas, such as nitrogen.

When it is desirable to speed up the removal of by-products resulting from the reduction reaction and/or unreacted species, an inert gas pulse (also referred to as inert gas purge) can be introduced to the reaction space after each metal source compound-reducing agent pulse pair. When operating according to the second embodiment of the present invention, an inert gas purge is preferably fed into the reaction space after each pulse of the second reagent. The inert gas purge typically comprises an inactive gas, such as nitrogen, or a noble gas, such as argon.

The deposition can be carried out at normal pressure but it is preferred to operate at reduced pressure. The pressure in the reaction space is typically 0.1–100 mbar, preferably lowered to 1–10 mbar.

In the present process, elevated temperatures are used. The temperature in the reaction space is determined by the substrate. The temperature of the substrate is selected so as to be high enough to avoid the condensation of the source materials on the substrate and low enough to keep the bonds between layers beneath the substrate surface intact. Depending on the reactants and the pressure the temperature of the substrate is typically 100–500° C., preferably to 250–400° C.

The temperature in the reaction space must be such that the desorption rate of the reaction by-products from the surface of the substrate is so high as to enable essentially all the by-products to leave the substrate surface. If the temperature in the reaction space is too low, then some of the reaction by-products may be incorporated into the formed thin film. At high temperatures the source material may decompose and some condensable impurity phase may form to the surface of the substrate from the unintentionally decomposing source chemical.

The temperature of the source material in the source container (i.e., the source temperature) must preferably be lower than the temperature in the reaction space in order to avoid the unintentional condensation of source material on the substrate surface. As an example, if the temperature in the reaction space is 400° C., the maximum source temperature should be below 400° C.

The deposition process is carried out until a thin film of desired thickness is obtained. The amount of time needed for a certain thickness of film is determined by the rate of reaction of the two source materials. A higher substrate temperature usually increases the rate of reaction. On the other hand, in the cases where the reaction between the starting materials is fast, the deposition process can be made faster by increasing the flow rates of the source materials.

The substrate on which the thin film is grown can be of various types. Examples include silicon, silica, coated silicon, copper metal, copper metal alloys, aluminium metal and transition metal nitrides. In particular, silicon wafers are used as substrates.

The Source Materials

Both source materials (i.e., the metal source material and the reducing agent) have to be chosen so that the requirements for sufficient vapour pressure, sufficient thermal stability at substrate temperature, and sufficient reactivity of the source materials, are fulfilled.

Sufficient vapour pressure means that at the source temperature, the evaporation rate of the source chemical must be high enough to enable economical growth rate of thin film on the substrates. As a rough estimate it can be said that the vapour pressure of the source material must be at least 0.05 mbar at the source temperature. The upper limit for the source temperature is, as already discussed, set by the temperature of substrate.

In practice, sufficient thermal stability means that the source chemical itself must not form growth-disturbing condensable phases on the substrates or leave harmful levels of impurities on the substrate surface through thermal decomposition. Thus, one aim is to avoid non-controlled condensation of molecules on substrates. When using reducing agents comprising organic ligands, the temperature in the reaction space is typically limited by the thermal decomposition of the reducing agent in the gas phase. For example, it was noticed in our experiments that boron with ethyl groups started to decompose detrimentally when the temperature in the reaction space exceeded 400° C.

Reactivity of the source chemicals must be suitable in order to achieve surface-controlled thin film growth by CVD. In CVD, "surface-controlled" means that the surface controls the reaction between the source chemicals when the reactants are near the surface. High reactivity of source chemicals easily leads to gas phase nucleation and non-uniform condensation of non-volatile species. Too low reactivity of source chemicals towards each other prevents the thin film growth on substrates.

In case of boron compounds, the reactivity can be controlled by choosing suitable groups around the boron atom located at the centre of the compound, which can also be called "the reduction centre". For example, the length or branching of hydrocarbon groups have an effect on the shielding of the centre atom against the surroundings. Thus, bulky ligands can be used for shielding the reduction centre. According to one embodiment, on one side of the centre atom there is a small group or ligand while the other sides are protected by large, bulky groups or ligands. This way the molecule still has reactivity but the rate of reaction is decreased to a useful level. The groups bonded to the reduction centre are called "bulky", because they can be considerably larger than covalently bound hydrogen. By "useful level" is meant that the concentration of source materials can be kept essentially uniform over the substrate.

The rate of reaction is not only related to the reactivity of the source chemicals, but also to the temperature in the reaction space. When the reaction between the two source materials is very fast, a non-uniform growth rate of the thin film over the substrate may be obtained, since if the rate of reaction is high, there will be less source material molecules near the substrate especially at the exhaust side of the substrate. It is, however, easily understood that a slow reaction decreases the throughput of the process and can thus be economically undesirable.

Further selecting criteria may include the availability of the chemical in a high purity, and the easiness of handling, inter al., reasonable precautions.

1. Metal Source Materials

The films typically grown are transition metal and transition metal carbide thin films. Thus, the metal source materials most typically used are volatile or gaseous compounds of elements of groups 4, 5, 6, 7, 8, 9, 10 and/or 11 (according to the system recommended by IUPAC) in the periodic table of elements. In particular, the film consists essentially of carbides of titanium (Ti), zirconium (Zr), hafnium (Hf), vanadium (V), niobium (Nb), tantalum (Ta), chromium (Cr), molybdenum (Mo), tungsten (W), manganese (Mn), rhenium (Re), iron (Fe), cobalt (Co), nickel (Ni) and/or elemental metals of copper (Cu), silver (Ag), gold (Au), palladium (Pd), platinum (Pt), rhodium (Rh), iridium (Ir), ruthenium (Ru) and/or osmium (Os) and, thus, gaseous or volatile compounds of these are preferably used in the method of the present invention.

Metal source compounds preferably used in this invention are halides of the above-identified metals. Halide compounds include the fluorides, chlorides, iodides and bromides of each metal. It is possible to use any volatile compound which includes at least one bond between chlorine, bromine, fluorine or iodide and a metal atom.

According to one embodiment of the present invention, compounds including a halide group and an organic ligand bonded to the metal atom are used. These compounds have the general formula (I)

$$R_{(m-n)}MX_n \qquad (I)$$

wherein

R is cyclic or linear, optionally branched, saturated or unsaturated $C_1$–$C_6$ hydrocarbon radical, M is a transition metal, e.g. Ti, X is a halide, preferably Cl, m is the valence of the transition metal M and n is an integer having values 1–6, with the proviso that n<m.

Since the properties of each metal compound vary, the suitability of each metal compound for the use in the process of the present invention has to be considered. In addition to the above-discussed criteria common for all the source materials, the vapour pressure of the metalloid film at the conditions in the reaction space has to be so low that the evaporation rate of the thin film is smaller than the formation rate of the metalloid from the CVD source chemicals.

The properties of the compounds are found, e.g. in Gmelin Handbook of Inorganic and Organometallic Chemistry, Gmelin-Institut fur Anorganische Chemie. Databases in electronic form are also useful tools for estimating a theoretical vapour pressures of specific metal compounds. An example of this kind of a database is HSC Chemistry, latest version 4.0, Outokumpu Research Oy, Finland. These data sources are advantageously also used in determining a suitable source temperature for a particular source material.

The affinity of carbon to a metal, i.e. the carbide formation has been presented in Kirk-Othmer, Encyclopedia of Chemical Technology, $4^{th}$ ed., vol. 4, page 842.

The metal compounds preferably used in the present process are, thus, transition metal halides. Particularly preferably the metal source material is selected from the group consisting of halides of tungsten, in particular $WF_6$, $WF_5$, $WCl_6$, $WCl_5$, $WBr_6$ and $WBr_5$, halides of copper, in particular $CuCl$, $Cu_2Cl_2$, $CuBr$, $Cu_2Br_2$, $CuI$ and $Cu_2I_2$.

halides of titanium, in particular $TiF_4$, $TiCl_4$, $TiCl_3$, $Ti_2Cl_6$, $TiBr_4$ and $TiI_4$, organotitanium halides, in particular cyclopentadienyltitanium trichloride $(C_5H_5)TiCl_3$, halides of tantalum, in particular $TaF_5$, $TaCl_5$, $TaBr_5$ and $TaI_5$, halides of zirconium, in particular $ZrCl_4$ and $ZrBr_4$, halides of hafnium, in particular $HfCl_4$, $HfBr_4$ and $HfI_4$, halides of niobium, in particular $NbF_5$, $NbCl_5$ and $NbBr_5$, halides of molybdenum, in particular $MoF_6$, $MoF_5$ and $MoCl_5$, halides of chromium, in particular $CrF_5$, and halides of gold, in particular $AuF_3$, $AuCl_3$ and $Au_2Cl_6$.

2. The Reducing Agent

The reducing agents are chosen bearing in mind the same criteria as for the metal source materials. In general, the reducing agent can be any volatile, thermally sufficiently stable and reactive boron compound comprising at least one boron-carbon bond and being capable of reducing the metal source material into elemental metal or metal carbide.

In general, in the process according to the present invention the reducing agent reduces the metal source material into elemental metal or metal carbide, which is deposited on the surface of the substrate. The residue of the metal source material typically forms compound(s) with the reducing agent. These are called the reaction by-products. In other words, during the reduction reaction at least one boron-carbon bond of the reducing agent breaks so that the halogen in the metal source material can break its bond to the metal and form a bond to boron. In the reducing agent, on the other side of the broken bond there is a group with a carbon atom that has an electron capable of forming a bond. This group can leave the reaction space as a radical or, preferably, form a bond to another halogen that breaks its bond with the metal in the metal source compound. Thus, the reduction process moves the halogen from the metal source compound to the reducing agent. In the case of carbide deposition, the group with a carbon atom also acts as a carbon source.

The reactions of different metal source materials with one and same reducing agent (and vice versa) can lead to different reaction products. According to the present invention, the metal source material and reducing agent are selected so that the resulting boron compound(s) is (are) gaseous and stabile. By this is meant that the compound formed is gaseous enough to be moved from the reaction space, optionally with the aid of the inert purging gas, and, on the other hand does not decompose e.g. catalytically or thermally to condensable species. In all, by-products should not remain as impurities in the films.

The selection of suitable materials can be facilitated with computer programs having a sufficiently extensive thermodynamics database, which enables to check the reaction equilibrium and thus predict which reactants have thermodynamically favourable reactions. An example of this kind of programs is ISC Chemistry, version 4.0 (1999) by Outokumpu Research Oy, Pori, Finland.

According to one embodiment of the present invention, a boron compound being capable of reducing the used metal source material and having at least one boron-carbon bond is used as the reducing agent. Boron can form a series of volatile halides that leave the reaction space. It is also expected that especially alkyl groups around boron atom can bind to the halogen of the metal source material, and leave the reaction space together with the gaseous boron halides.

The boron compounds preferably used in the present process are selected from the group consisting of boron compounds comprising one or more alkyl, aryl, arylalkyl and/or halogen group(s) bonded to the boron atom.

A particularly preferred group of compounds is the one having the general formula (II)

$$(R^1)_{3-p}BX_p \qquad (II)$$

wherein $R^1$ is a linear or branched $C_1$–$C_6$, in particular $C_1$–$C_2$ alkyl group or an aryl group, each $R^1$ being selected independently of the other(s), X is a halogen, such as chlorine, bromine, fluorine or iodine, and p=0, 1 or 2.

Of the compounds satisfying the formula (II), the following particularly preferred groups can be mentioned;

trialkylborons, also known as organoboranes, in particular trimethylboron $(CH_3)_3B$, triethylboron $(CH_3CH_2)_3B$ and methyldiethylboron $(CH_3)(CH_3CH_2)_2B$, mono- and dialkylboron halides, also known as organohaloboranes, in particular ethylboron dichloride $(CH_3CH_2)BCl_2$ and dimethylboron bromide $(CH_3)_2BBr$, triarylborons, such as triphenylboron $(C_6H_5)_3B$, and mono- and diarylborons and -boron halides, such as dimethylphenylboron $(CR_3)_2(C_6H_5)B$, phenylboron dibromide $C_6H_5BBr_2$ and diphenylboron chloride $(C_6H_5)_2BCl$.

Another preferred group comprising alkyl groups bonded to boron are allylboranes, i.e., boranes in which at least one hydrogen is replaced by an alkyl group, such as ethyldiborane $(CH_3CH_2)B_2H_5$, methylethyldiborane $(CH_3)(CH_3CH_2)B_2H_4$ and trimethyldiborane $(CH_3)_3B_2H_3$.

According to another embodiment of the present invention, a metal source chemical is selected from a group of volatile metal halides for the deposition of a metal carbide thin film The said metal must have high affinity towards carbon and the formation enthalpy of the metal carbide must be negative, i.e. thermodynamically favourable. A volatile boron compound having at least one boron—carbon bond is used for lowering the oxidation state of the metal in the metal halides and, at the same time, the said boron compound is used as a carbon source for the formation of a solid metal carbide. The same boron compounds, that are used for the deposition of elemental metals having low affinity towards carbon, can be used for the deposition of metal carbides. Metals having high affinity towards carbon, i.e. capable of binding carbon strongly to the neighbourhood of the said metal, are titanium (Ti), zirconium (Zr), hafnium (If), vanadium (V), niobium (Nb), tantalum (Ta), chromium (Cr), molybdenum (Mo), tungsten (W), manganese (Mn), rhenium (Rh), iron (Fe), cobalt (Co) and nickel (Ni). These metals form stable metal carbides according to Kirk-Othmer, Encyclopedia of Chemical Technology, 4th ed., vol. 4, page 842. The metalloid properties, e.g. electrical conductivity, are most clearly seen in carbides of Ti, Zr, Hf, V, Nb, Ta, Cr, Mo and W.

It is to be noted that in the case of metal carbide deposition, the oxidation state of the metal in the source metal compound is not lowered with the boron compound to the elemental, i.e. zero, value but to an intermediate value. For example, tungsten in $WF_6$ source chemical has an oxidation state of +6 but in the resulting metal carbide thin film, e.g. $W_3C$, tungsten has a non-zero oxidation state which is, however, lower than the original +6

The following non-limiting examples illustrate the invention.

EXAMPLE 1

A 200-mm silicon wafer was loaded to the reaction space, of a Pulsar 2000 reactor. The pressure of the reaction space was adjusted to 5–10 mbar with a vacuum pump and a nitrogen mass flow controller. The substrate was heated to 380° C. Tungsten hexafluoride $WF_6$ and triethylboron $(CH_3CH_2)_3B$, shortened as TEB, were evaporated from external source bottles at room temperature. Both source chemicals were flowing simultaneously to the reaction space. High-purity nitrogen gas was used as a carrier for the source chemicals.

As a result, a thin film with metallic lustre grew on reaction space surfaces in CVD-mode. The thin film on the wafer had low resistivity. The deposition time was less than 10 minutes. However, it is expected that optimization of the deposition temperature and the flow rates of source chemicals enables to shorten the deposition time, Analysis by TOF-ERDA (Time-of-Flight Elastic Recoil Detection Analysis) revealed that the film consisted essentially of W and C in an atomic ratio of 3 to 1. XRD (X-ray Diffraction) indicated the presence of a $W_3C$ phase, to the utter amazement of the inventors.

EXAMPLE 2

A 50 mm*50 mm piece of a silicon wafer was loaded to the reaction space of an F-120 reactor. The pressure of the reaction space was adjusted to 3–10 mbar with a vacuum pump and a nitrogen mass flow controller. There was a continuous nitrogen flow through the reaction space during the deposition. The substrate was heated to 350–370° C. Analytically pure CuCl powder was loaded in a glass boat to a solid source zone of the reactor. Depending on the deposition test, the CuCl source temperature was chosen from values between 340 and 360° C. Triethylboron (TEB) was evaporated at room temperature from an external source bottle High-purity nitrogen gas was used as a carrier gas for the source chemicals.

Both CuCl and TEB were flowing simultaneously to the reaction space during the deposition. As a result, a thin film with copper metal colour grew on the substrate in CVD-mode. The film was electrically conductive.

Analysis by TOF-ERDA (Time-of-Flight Elastic Recoil Detection Analysis) revealed that the films consisted essentially of copper metal.

Copper did not form any compounds with carbon, probably because the only known inorganic copper-carbon compound copper acetylide $Cu_2C_2$ is inherently unstable and explodes spontaneously. Thus, the process was favourable for the formation of elemental copper. The film thickness was controlled by the deposition time.

What is claimed is:

1. A method of growing elemental Cu, Ag, Au, Pd, Pt, Rh, Ir, Ru and/or Os thin films on a substrate by a chemical vapor deposition type process comprising:

vaporizing a metal source material and a reducing agent capable of reducing the metal source material to elemental metal;

feeding the metal source material and the reducing agent into a reaction space; and contacting the metal source material and the reducing agent with the substrate, wherein the reducing agent is a boron compound having the general formula (II)

$$(R^1)_{3-p}BX_p \qquad (II)$$

wherein $R^1$ is selected from the group consisting of a linear $C_1$–$C_6$ group, a branched $C_1$–$C_6$ group, and an aryl group, each $R^1$ being selected independently of the other(s), X is a halogen, and p=0, 1 or 2.

2. A method according to claim 1 wherein the boron compound is an alkylboron compound.

3. A process for growing copper and/or gold thin films on a substrate by a chemical vapor deposition type process, comprising:

vaporizing a metal source material and a reducing agent capable of reducing the metal source material to elemental metal;

feeding the metal source material and the reducing agent into a reaction space; and contacting the metal source material and the reducing agent with the substrate, wherein the reducing agent is a boron compound containing at least one boron-carbon bond, and wherein the boron compound is capable of forming gaseous reaction by-products when reacted with the metal source material.

4. A method according to claim 3 wherein the boron compound is an alkylboron compound.

5. A method of growing thin film carbides of Ti, Zr, Hf, V, Nb, Ta, Cr, Mo, W, Mn, Re, Fe, Co and/or Ni on a substrate by a chemical vapor deposition type process comprising:

vaporizing a metal source material and a reducing agent capable of reducing the metal source material to elemental metal;

feeding the metal source material and the reducing agent into a reaction space; and contacting the metal source material and the reducing agent with the substrate, wherein the reducing agent is a boron compound that has the general formula (II)

$$(R^1)_{3-p}BX_p \qquad (II)$$

wherein $R^1$ is selected from the group consisting of a linear $C_1$–$C_6$ group, a branched $C_1$–$C_6$ group, and an aryl group, each $R^1$ being selected independently of the other(s), X is a halogen, and p=0, 1 or 2.

6. A method according to claim 5 wherein the boron compound is an alkylboron compound.

7. A method according to claim 5 wherein the boron compound is a carbon source chemical of the growing carbide thin film.

8. A method of growing tungsten carbide thin films on a substrate by a chemical vapor deposition type process comprising:

vaporizing a metal source material and a reducing agent capable of reducing the metal source material to elemental metal;

feeding the metal source material and the reducing agent into a reaction space; and contacting the metal source material and the reducing agent with the substrate, wherein the reducing agent is a boron compound that has the general formula (II)

$$(R^1)_{3-p}BX_p \qquad (II)$$

wherein $R^1$ is a linear or branched $C_1$–$C_6$, each $R^1$ being selected independently of the other (s), X is a halogen, and p=0, 1 or 2.

9. A method according to claim 8 wherein the boron compound is an alkylboron compound.

10. A method according to claim 8 wherein the boron compound is a carbon source chemical of the growing carbide thin film.

* * * * *